US006773977B1

(12) United States Patent
Reynes et al.

(10) Patent No.: US 6,773,977 B1
(45) Date of Patent: Aug. 10, 2004

(54) METHOD OF FORMING A DIODE FOR INTEGRATION WITH A SEMICONDUCTOR DEVICE AND METHOD OF FORMING A TRANSISTOR DEVICE HAVING AN INTEGRATED DIODE

(75) Inventors: Jean-Michel Reynes, Pompertuzat (FR); Ivana Deram, Colomiers (FR); Evgueniy Stefanov, Toulouse (FR)

(73) Assignees: Freescale Semiconductor, Inc., Austin, TX (US); Semiconductor Components Industries, LLC, Phoenix, AZ (US)

( * ) Notice: Subject to any disclaimer, the term of this patent is extended or adjusted under 35 U.S.C. 154(b) by 635 days.

(21) Appl. No.: 09/715,748

(22) Filed: Nov. 17, 2000

(30) Foreign Application Priority Data

Nov. 17, 1999 (EP) .............................. 99402846

(51) Int. Cl.[7] ......................................... H01L 21/8234
(52) U.S. Cl. ...................... 438/237; 438/230; 438/231; 438/233
(58) Field of Search .......................... 438/237; 257/345, 257/344, 373, 360

(56) References Cited

U.S. PATENT DOCUMENTS 4,227,203 A    10/1980    Mikoshiba 5,763,916 A  *  6/1998   Gonzalez et al. ........... 257/345
5,985,708 A     11/1999  Nakagawa et al.
6,091,114 A  *  7/2000   Mogul et al. ................ 257/360

FOREIGN PATENT DOCUMENTS

| EP | 0276692 A2 | 8/1988 |
| EP | 0372820 A1 | 6/1990 |
| JP | 11135776   | 5/1999 |

* cited by examiner

Primary Examiner—David Nelms
Assistant Examiner—Renee R. Berry

(57) ABSTRACT

The present invention relates to a method of forming a diode (2) for integration with a semiconductor device comprising the steps of providing a layer (4) of semiconductor material, forming a dielectric layer (6) over the layer of semiconductor material, introducing a first conductivity type dopant into the dielectric layer (6), forming a semi-conductive layer (8) over the dielectric layer (6), introducing a second conductivity type dopant into a first region (12) of the semi-conductive layer and re-distributing the first conductivity type dopant from the dielectric layer (6) into the semi-conductive layer (8) so as to form a second region (18) of the first conductivity type dopant in the semi-conductive layer (8), the second region (18) being adjacent the first region (12) so as to provide a P/N junction of the diode (2).

8 Claims, 3 Drawing Sheets

METHOD OF FORMING A DIODE FOR INTEGRATION WITH A SEMICONDUCTOR DEVICE AND METHOD OF FORMING A TRANSISTOR DEVICE HAVING AN INTEGRATED DIODE

FIELD OF THE INVENTION

This invention relates to a method of forming a diode for integration with a semiconductor device and a method of forming a transistor device having an integrated diode.

BACKGROUND OF THE INVENTION

The use of a diode integrated with a semiconductor device, such as a power MOSFET device, as an integrated temperature sensor is well known. For example, the forward voltage of the diode is proportional to the temperature of the diode and so by monitoring the forward voltage across a diode integrated with a power device, the temperature of the power device can be monitored which is useful, for example, when tracking the device's temperature overshoot and subsequent shutdown.

Typically, an integrated diode is formed by doping a polysilicon layer with P-type and N-type dopants so as to form the diode's PIN junction. Although some of the process steps of forming such a polysilicon diode can be combined with the other processing steps for the semiconductor device, the known techniques all suffer from the disadvantage of requiring some additional process steps, e.g. additional masking steps for the P-type and N-type implant, and additional P-type and N-type implant steps, to create the diode. Additional process steps increase the complexity and cost of manufacture and provide additional opportunity for defects, which reduce the overall yield from such processes and reliability of the final product.

BRIEF DESCRIPTION OF THE DRAWINGS

A method of forming a diode for integration with a semiconductor device will now be described, by way of example only, with reference to the accompanying drawings in which.

DETAILED DESCRIPTION OF THE DRAWINGS

A method of forming a diode in accordance with the present invention for integration with a semiconductor device will now be described with reference to FIGS. 1–4. To avoid complexity, the details of the semiconductor device have been omitted from FIGS. 1–4. It will be appreciated that the steps used in the following process may be used in conjunction with and as part of the process operations for the fabrication of the semiconductor device. An example of such a semiconductor device and process is briefly described below with reference to FIGS. 5–11. The example described herein is the process flow for a MOSFET transistor device. It will be appreciated that the present invention may be used with any semiconductor device requiring an integrated diode e.g. IGBT devices.

Although in the following description the layers and regions will be described as having certain conductivity types and being comprised of certain materials, this is for illustrative purposes only. It is not intended that the invention be limited to the specific conductivity types or the specific materials referred to herein.

Figure 1:
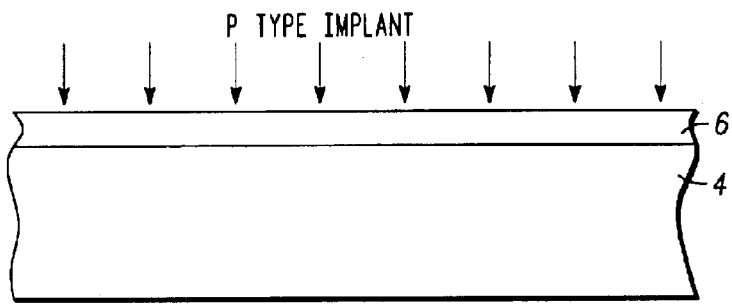
FIGS. 1–4 show simplified schematic cross-sectional diagrams of a diode during various stages of fabrication in accordance with the present invention.

Referring firstly to FIG. 1, a layer 4 of semiconductor material, which is preferably an N conductivity type epitaxial layer, is provided. A dielectric layer 6 is formed over the epitaxial layer 4. In the preferred embodiment, the dielectric layer 6 is an oxide layer having a thickness of 0.6 microns. A P conductivity type dopant is then introduced into the dielectric layer 6, for example, by implantation of boron B11 or boron di-fluoride BF2 or other P-type dopant.

Figure 2:
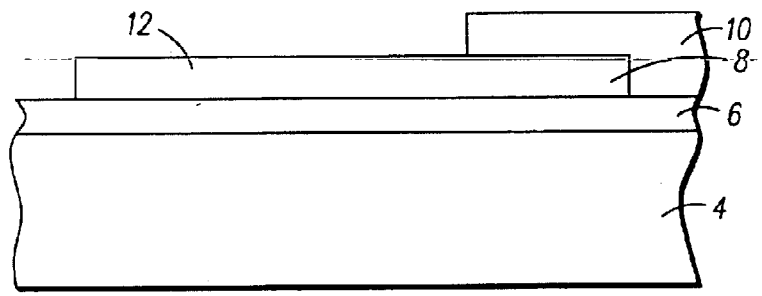
Figure 3:
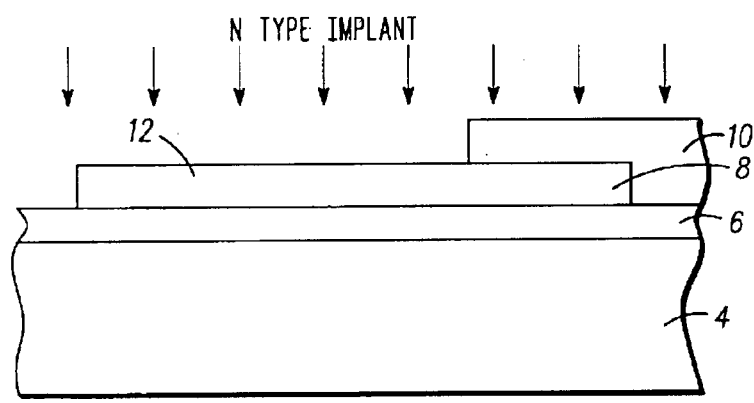

After the implantation step, a semi-conductive layer 8 is formed over the doped dielectric layer 6, FIG. 2. Preferably, the semi-conductive layer 8 is a layer of polysilicon material or oxygen doped polycrystalline silicon (SIPOS) material deposited on the dielectric layer 6 by standard deposition techniques. The P-type implantation parameters are selected such that the concentration of P conductivity type dopant in the subsequently outdiffused semi-conductive layer 8 is sufficient to ensure a good ohmic contact with a diode. This is typically at least 1 E18 atoms per $cm^{-3}$.

A photoresist mask 10 is then formed over the semi-conductive layer 8 and is patterned to expose a first region 12 of the semi-conductive layer 8. An N conductivity type dopant is then introduced into the semi-conductive layer 8, for example, by implantation of phosphorous, arsenic or other N conductivity type dopant (see FIG. 3). The implantation parameters are selected such that the concentration of N conductivity type dopant in the first region 12 of the semi-conductive layer 8 is sufficient to ensure a good ohmic contact between the N doped first region 12 and a diode contact. This is typically around 5–6 E19 atoms per $cm^{-3}$.

The mask 10 is then removed.

Figure 4:
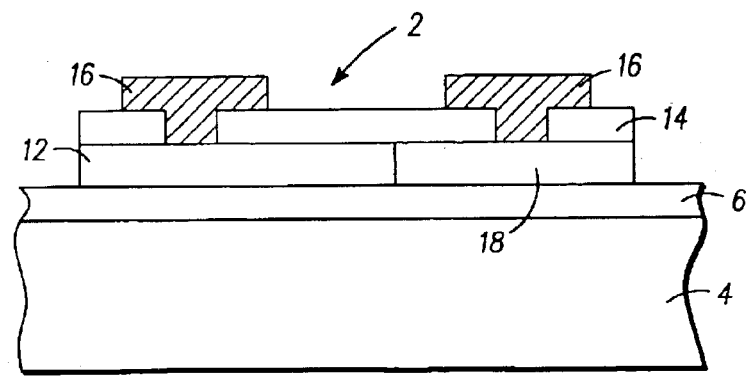

A cap layer 14 is formed over the semi-conductive layer 8, FIG. 4. Cap layer 14 typically comprises at least one dielectric layer and preferably comprises an oxide/nitride/oxide sandwich. The structure is then treated such that the P conductivity type dopant in the dielectric layer 6 is re-distributed into the semi-conductive layer 8 such that a second region 18 of P conductivity type is formed in the semi-conductive layer 8. The second region 18 corresponds to the region protected by the photoresist mask 10 from the N conductivity type implantation. In the preferred embodiment, for re-distribution of the dopants or outdiffusion of the dopants, the device is subjected to a high temperature heat treatment, for example, the device is heated to a temperature of greater than 1000° C. for two hours. During the re-distribution step, some of the P conductivity type dopant also diffuses into the first region 12 and some of the N conductivity type dopant diffuses into the second region 18 but in the first region 12, N is the majority carrier and in the second region 18, P is the majority carrier. The first 12 and second 18 regions are adjacent one another and provide the P/N junction of the integrated diode 2.

First and second openings are then formed in the cap layer 14 such that they extend to the first 12 and second 18 regions of the semi-conductive layer, respectively. Metal contacts are then formed in the first and second openings to the first 12 and second 18 regions of the semi-conductive layer to provide the diode contacts 16.

The invention has been described starting with a blanket P conductivity type implantation step followed by an N conductivity type implantation step into the semi-conductive layer. Alternatively, an N conductivity type blanket implantation step could be used followed by a P conductivity type implantation step into the semiconductive layer. Good ohmic contacts are required between the first 12 and second 18 regions of the semi-conductive layer 8 and the contacts 16. To ensure a good ohmic contact a higher concentration of N dopant is needed in the N type region compared to the concentration of P dopant in the P type region. This means that although it is possible to start with a blanket N type implantation, a blanket P type implantation is preferred.

The present invention thus provides a method for forming a diode integrated with a semiconductor device wherein the P and N regions of the device are formed by one blanket implant step into a dielectric layer, one implant step into a semi-conductive layer, such as a polysilicon layer, with a mask and a re-distribution step wherein the dopant from the dielectric layer is out-diffused into the polysilicon layer. The blanket implant and re-distribution step avoids the need for an additional implant and extra mask. This can provide significant cost savings for the final product.

The present invention will now be described with reference to the fabrication of a particular type of semiconductor device having an integrated diode in accordance with the present invention. In the following description the semiconductor device is a High Density MOSFET device. Not all the steps are shown for simplicity. The fabrication of such devices are well known in the art. Like components to those of FIGS. 1–4 are referenced by the same reference numeral plus 100.

Figure 5:
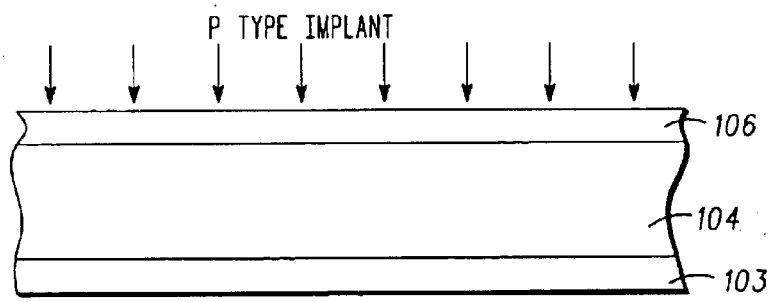
FIGS. 5–11 show simplified schematic cross-sectional diagrams of a transistor device having an integrated diode in accordance with the present invention during various stages of fabrication.

Referring now to FIG. 5, a first dielectric layer 106 is formed over a layer 104 of semiconductor material, which in the preferred embodiment is an N type epitaxial layer. The epitaxial layer 104 is formed over an N-type substrate 103. In the preferred embodiment, the dielectric layer 106 is an oxide layer having a thickness of 0.6 microns. A P conductivity type dopant is then introduced into the oxide layer 106, for example, by implantation of boron B11 or boron di-fluoride BF2 or other P-type dopant.

Figure 6:
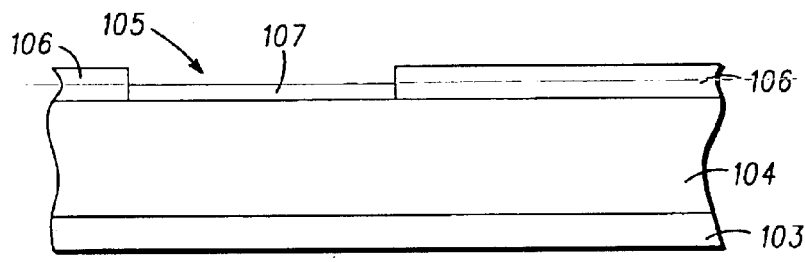

The doped oxide layer 106 is patterned so as to provide an opening 105 in the oxide layer 106 extending to the epitaxial layer 104 (FIG. 6). The opening 105 forms an active area 105 of the transistor device. A second dielectric layer 107 having a thickness of 0.04 microns is formed on the epitaxial layer 104 in the active area 105. Preferably this second dielectric layer 107 is an oxide layer 107 formed by thermal diffusion. The second dielectric layer 107 is a gate oxide layer 107.

Figure 7:
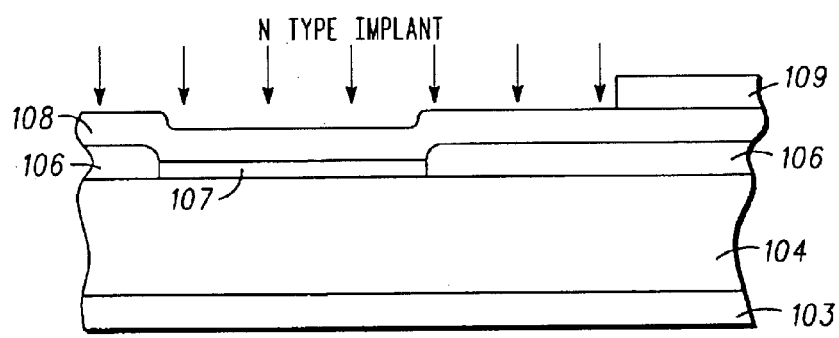

In FIG. 7, a semi-conductive layer 108, such as a polysilicon layer, is formed over the oxide layer 106 and the gate oxide layer 107. The polysilicon layer 108 has a thickness of approximately 0.5 microns and may be formed by deposition such as Low Pressure Chemical Vapour Deposition (LPCVD). A i photoresist mask is deposited on the polysilicon layer 108 and patterned to leave a portion 109 on the polysilicon layer 108 over the oxide layer 106. The portion 109 protects a region of the polysilicon layer 108 which will become a diode region 118 of the integrated diode.

An N conductivity type dopant is then introduced into the polysilicon layer 108, for example, by implantation of phosphorous, arsenic or other N conductivity type dopant. As an example, a dose of 5 E15 atom per $cm^{-3}$ of phosphorous at an energy of 50 keV may be used for the N-type implantation step. The mask portion 109 ensures that the region of the polysilicon layer 108 underneath the mask portion 109 is not doped with phosphorous. After the implantation step, the mask portion 109 is removed. A portion of the N-type doped polysilicon layer 108 forms the polysilicon gate of the MOSFET device.

Figure 8:
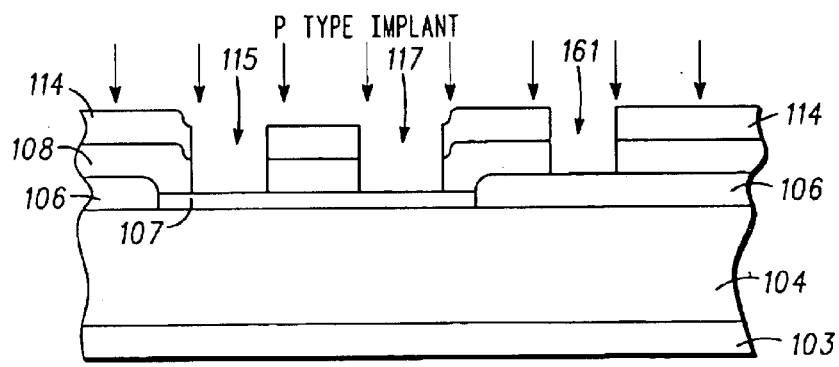

A cap layer 114 is then formed over the polysilicon layer 108 (FIG. 8). The cap layer 114 may comprise a combination of oxide/nitride/oxide layers formed by deposition and is used to provide protection against contamination. Openings 115 and 117 are then formed in the cap layer 114, polysilicon layer 108 to the gate oxide layer 107 in the active area 105 to define the gate. In the same process step, openings 161 (only one of which is shown in FIG. 8) are formed in the cap layer 114 and the polysilicon layer 108 to the oxide layer 106 to isolate the diode from the rest of the polysilicon layer 108.

Figure 9:
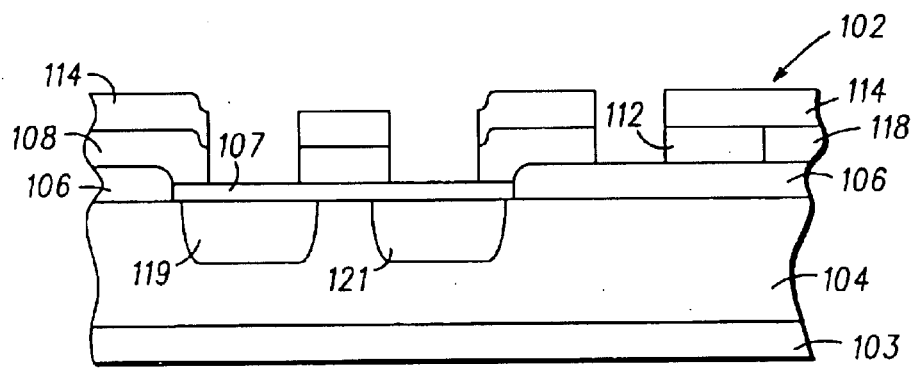

A P conductivity type dopant is then introduced into the epitaxial layer 104 through the openings 115 and 117 by, for example, implanting boron B11 at a dose in the range of $1E14$ $cm^{-2}$. The cap layer 114 prevents the P-type dopant from being implanted into the polysilicon layer 108. After the implant, the device is heated to approximately 1100° C. for two hours to drive the P-type dopant into the epitaxial layer 104 to form PHV regions 119 and 121 as shown in FIG. 9. During the heat treatment, the P-type dopant in the oxide layer 106 is re-distributed into the polysilicon layer 108 such that a P-type region 118 is formed in the polysilicon layer 108 adjacent a N-type region 112 in the polysilicon region 108. These N-type region and P-type region form the diode regions of an integrated diode 102.

Figure 10:
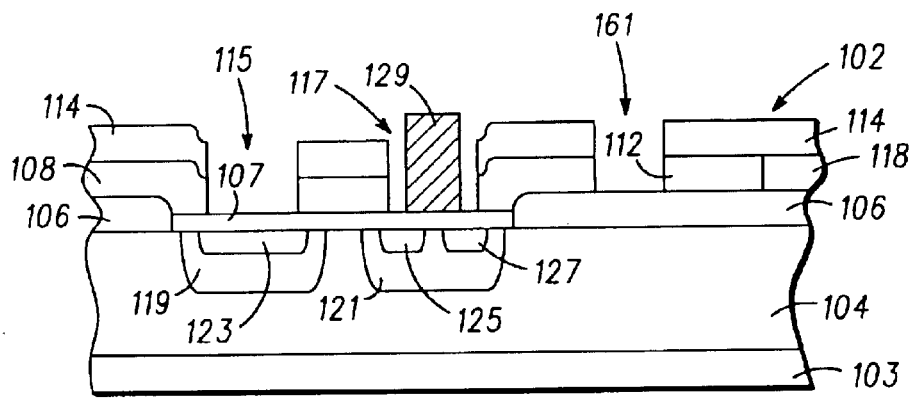

In FIG. 10, a block mask 129 is formed in opening 117. An N conductivity type dopant is then introduced into the PHV regions 119 and 121 by, for example, implanting arsenic at a dose in the range of $1E16$ $cm^{-2}$ to form N-type regions 123, 125 and 127 in the PHV regions 119 and 121. N-type region 123 forms the source region of the MOSFET device.

A dielectric layer is deposited and etched to form spacers 150 in the openings 115, 117 and 161. A blanket P-type implant, followed by a thermal anneal is used to form body regions 152, 154 (FIG. 11).

Openings are then formed in the cap layer 114 to the polysilicon layer 108 for the gate contact and the diode contacts. Metal is then deposited over the device, masked and etched to leave the source contact 131, gate contact 133 and diode contacts 116.

Although not shown in FIGS. 5–11, a drain contact is made to the backside of the device.

Figure 11:
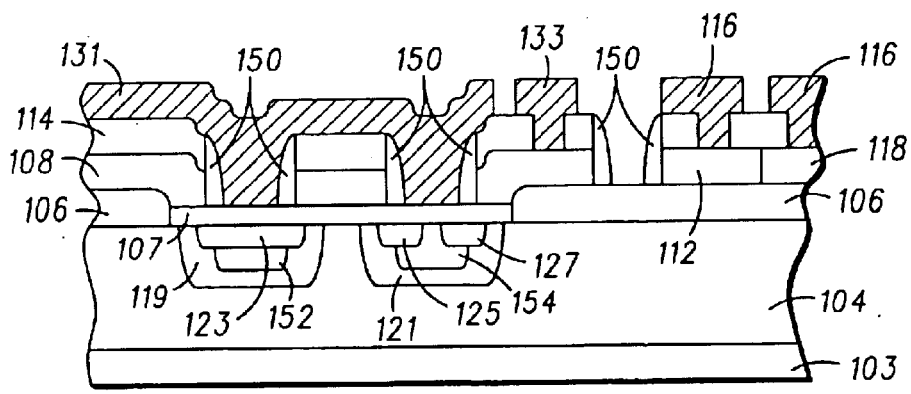

FIG. 11 shows a diode 102 integrated with a MOSFET transistor 135. In summary, diode 102 is formed by utilising a blanket P-type implantation step for implanting P-type dopant into the oxide layer 106, using the N-type implantation step which is used to form the polysilicon gate of the MOSFET device to form the N-type region 112 of the diode 102 and out-diffusing the P-type dopant from the oxide layer into a region of the polysilicon layer 108 to form the P-type region of the diode 102. The diode contacts are formed during the step of forming the gate contact. Thus, only an additional blanket implant step and a single mask must be added to the standard MOSFET process to form the integrated diode 102. Compared to the prior art technique which requires a mask and an implant for each diode region, the present invention provides significant cost savings.

By performing the P-type blanket implantation before etching the oxide layer 106, this ensures that no p-type dopant diffuses through the gate oxide 107 into the epitaxial layer 104 or the polysilicon layer 108 in the active area 105 which can adversely affect the on-resistance Rdson of the MOSFET device. In other words, out-diffusion of the P-type dopant occurs in the oxide layer 106 only and not in the gate oxide layer 107.

What is claimed is:

1. A method of forming a diode for integration with a semiconductor device comprising the steps of:
   providing a layer of semiconductor material;
   forming a dielectric layer over the layer of semiconductor material;
   introducing a first conductivity type dopant into the dielectric layer;
   forming a semi-conductive layer over the dielectric layer;
   introducing a second conductivity type dopant into a first region of the semi-conductive layer; and
   redistributing the first conductivity type dopant from the dielectric layer into the semi-conductive layer so as to form a second region of the first conductivity type dopant in the semi-conductive layer, the second region being adjacent the first region so as to provide a P/N junction of the diode.

2. A method of forming diode for integration with a semiconductor device comprising the steps of:
   providing a layer of semiconductor material;
   forming a dielectric layer over the layer of semiconductor material;
   introducing a first conductivity type dopant into the dielectric layer;
   forming a semi-conductive layer over the dielectric layer;
   introducing a second conductivity type dopant into a first region of the semi-conductive layer; and
   re-distributing the first conductivity type dopant from the dielectric layer into the semi-conductive layer so as to form a second region of the first conductivity type dopant in the semi-conductive layer, the second region being adjacent the first region so as to provide a P/N junction of the diode,
   wherein the re-distributing step comprises heating the semiconductor device to diffuse the first conductivity type dopant into the semi-conductive layer.

3. The method according to claim 1 wherein the step of providing a layer of semiconductor material comprises the step of providing an epitaxial layer.

4. A method of forming a diode for integration with a semiconductor device comprising the steps of:
   providing a layer of semiconductor material;
   forming a dielectric layer over the layer of semiconductor material;
   introducing a first conductivity type dopant into the dielectric layer;
   forming a semi-conductive layer over the dielectric layer;
   introducing a second conductivity type dopant into a first region of the semi-conductive layer;
   forming a cap layer over the semi-conductive layer;
   re-distributing the first conductivity type dopant from the dielectric layer into the semi-conductive layer so as to form a second region of the first conductivity type dopant in the semi-conductive layer, the second region being adjacent the first region so as to provide a P/N junction of the diode,
   wherein the step of forming a cap layer occurs before the re-distributing step;
   forming first and second openings in the cap layer extending to the first and second regions of the semi-conductive layer; and
   forming contacts in the first and second openings to the first and second regions of the semi-conductive layer.

5. The method according to claim 4 wherein the cap layer comprises at least one dielectric layer.

6. The method according to claim 1 wherein the step of forming a semi-conductive layer comprises the step of forming a layer of one of the following materials: polysilicon, and oxygen doped polycrystalline silicon (SIPOS).

7. The method according to claim 1 wherein the step of introducing a second conductivity type dopant comprises the steps of:
   forming a mask over the semi-conductive layer;
   removing a portion of the mask so as to expose the first region of the semi-conductive layer; and
   implanting the second conductivity type dopant into the first region of the semi-conductive layer.

8. A method of forming a transistor device having an integrated diode, the method comprising the steps of:
   providing a layer of semiconductor material;
   forming a first dielectric layer over the layer of semiconductor material having a first thickness;
   introducing a first conductivity type dopant into the first dielectric layer;
   patterning the first dielectric layer so as to provide an opening in the fist dielectric layer extending to the layer of semiconductor material, the opening forming an active area of the transistor device;
   forming a second dielectric layer over the layer of semiconductor material in the active area having a second thickness, the first thickness being greater than the second thickness;
   forming a semi-conductive layer over the first and second dielectric layers;
   introducing a second conductivity type dopant into the semi-conductive layer over the active area and into a first region of the semi-conductive layer over the first dielectric layer;
   forming a cap layer over the non-conductive region;
   forming openings extending through the cap layer, and semi-conductive layer to the second dielectric layer in the active area and to the first dielectric layer;
   introducing a dopant of the first conductivity type into the layer of semiconductor material through the openings in the active area;
   re-distributing the first conductivity type dopant from the first dielectric layer into the semi-conductive layer over the first dielectric layer so as to form a second region of the first conductivity type dopant in the semi-conductive layer, the second region being adjacent the first region so as to provide a P/N junction of the integrated diode and re-distributing the dopant of the first conductivity type in the layer of semiconductor material so as to form regions of the first; conductivity type in the semiconductor material;
   introducing a dopant of the second conductivity type into the regions of the first conductivity type to form a source region of the transistor device; and
   forming contacts to the source region, and the first and second regions.

* * * * *